DIGITAL STABILIZED MASTER OSCILLATOR WITH AUXILIARY HIGH FREQUENCY LOOP
Filed May 7, 1964

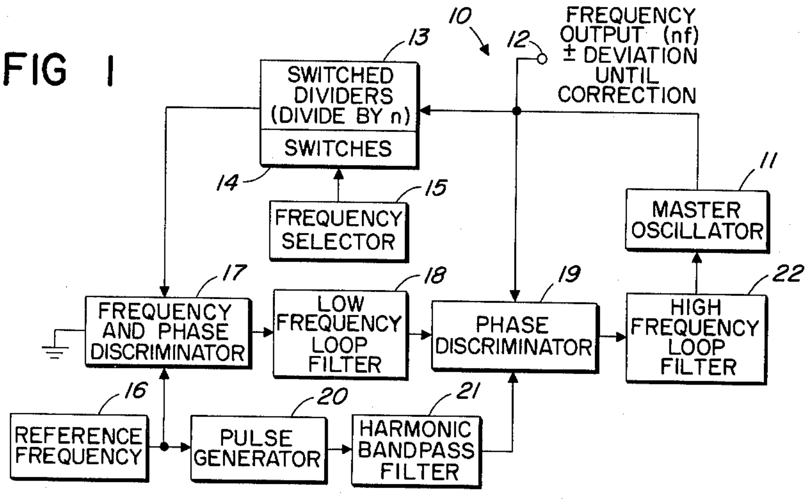
FIG 1

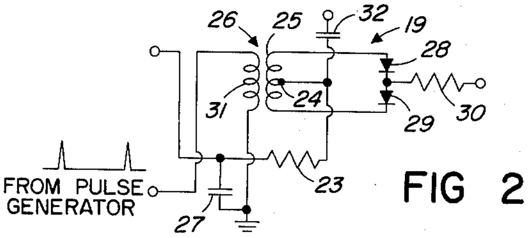
FIG 2

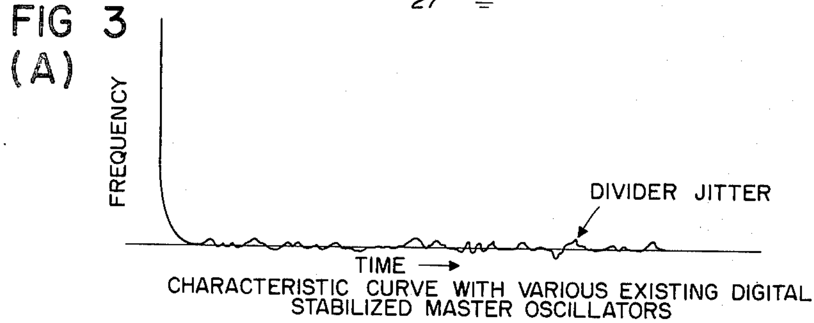
FIG 3 (A)

CHARACTERISTIC CURVE WITH VARIOUS EXISTING DIGITAL STABILIZED MASTER OSCILLATORS

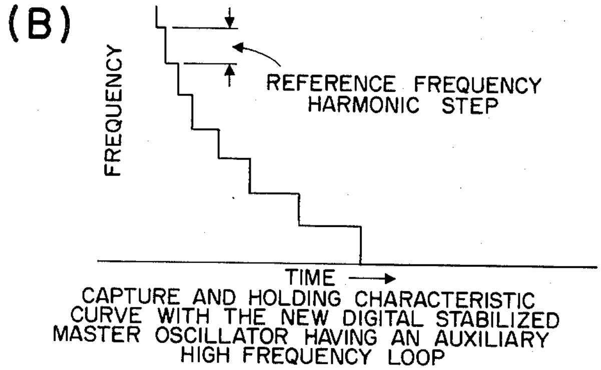
(B)

CAPTURE AND HOLDING CHARACTERISTIC CURVE WITH THE NEW DIGITAL STABILIZED MASTER OSCILLATOR HAVING AN AUXILIARY HIGH FREQUENCY LOOP

INVENTOR
SAMUEL L. BROADHEAD JR.
BY
Moody and Kintzinger
ATTORNEYS

3,212,023
DIGITAL STABILIZED MASTER OSCILLATOR WITH AUXILIARY HIGH FREQUENCY LOOP

Samuel L. Broadhead, Jr., Cedar Rapids, Iowa, assignor to Collins Radio Company, Cedar Rapids, Iowa, a corporation of Iowa Filed May 7, 1964, Ser. No. 365,742
4 Claims. (Cl. 331—11)

This invention relates in general to digital dividing type stabilized master oscillators, and in particular to a digital stabilized master oscillator system with a combined frequency and phase discriminator operating from a frequency divider output and a reference frequency in a low frequency loop, and with a pluse generator and an auxiliary phase discriminator operating directly from the master oscillator and the reference frequency through the pulse generator in a high frequency auxiliary direct loop.

Various digital dividing type stabilized master oscillators have been faced with phase jitter originating in the divider string. These systems, particularly those using only a phase discriminator with wide bandwidth single loop operation, are particularly susceptible to such divider string originated jitter.

It is, therefore, a principal object of this invention to provide a digital stabilized master oscillator system with an operating loop for frequency capture and long term holding, and an auxiliary loop for short term correction free from jitter.

Another object is to provide, in an auxiliary loop in a digital stabilized master oscillator system including an auxiliary phase discriminator comparing the reference frequency directly with the master oscillator frequency, a short term correction voltage for the master oscillator independent of frequency dividers and therefore free from divider string originated phase jitter.

A further object is to provide a digital stabilized master oscillator system with the frequency information in the frequency and phase discriminator permitting capture with a narrow bandwidth filter in the low frequency loop.

Features of this invention useful in accomplishing the above objects include, in a digital stabilized master oscillator having an auxiliary high frequency loop, a low frequency divided loop effecting capture and locking of the master oscillator on the correct selected frequency with precise long term stability and an auxiliary, direct, high frequency loop providing jitter free short term stability at the chosen frequency. The low frequency divided loop includes, from the switch frequency selector divider circuit, a frequency and phase discriminator developing a correction output voltage passed to and through a low frequency loop filter, having a bandpass, for example, up to approximately 10 c.p.s., to an auxiliary phase discriminator of the high frequency loop.

A reference frequency source provides a reference frequency input to the frequency and phase discriminator of the low frequency divided loop. In the direct high frequency loop, the reference frequency is fed to and through a pulse generator developing very narrow pulses at the reference frequency but having harmonic frequency content throughout the range of available selected master oscillator output frequencies. The output of the pulse generator in the direct high frequency loop is passed to and through a bandpass filter passing the harmonic frequencies of the reference frequency throughout the range of selected master oscillator output frequencies. The output of the harmonic bandpass filter is passed as an input to the auxiliary phase discriminator which is also receiving an input directly from the master oscillator to develop a correction voltage output combined with the low frequency loop correction voltage passed through the phase discriminator. The resulting output is passed to and through a high frequency loop filter having a bandpass, for example, up to approximately 2 kc., from which the correction voltage output is applied to the master oscillator.

During operation of the frequency selective master oscillator system, as the capture process begins, the high frequency loop will effectuate capture momentarily until the low frequency loop in its slower action has time to override the momentary high frequency loop capture to progressively drop down to the next multiple of the discriminator frequency, or pulse frequency harmonic step, to there hang momentarily. This process continues with the low frequency loop overriding successive high frequency loop capture frequencies in a doorstep-like frequency corrective action until the correct frequency is arrived at. When the correct selected frequency is arrived at, the low frequency loop as well as the high frequency loop are satisfied and remain so thereafter until such time as a different master oscillator output frequency is switched divider control selected.

A specific embodiment representing what is presently regarded as the best mode of carrying out the invention is illustrated in the accompanying drawing.

In the drawing:

FIGURE 1 represents a block diagram of a digital stabilized master oscillator with an auxiliary high frequency loop for effectively achieving phase capture and master oscillator output control selected frequency free of divider string originated jitter;

FIGURE 2, a detailed schematic of the auxiliary phase discriminator of the digital stabilized master oscillator of FIGURE 1; and in FIGURE 3, curve A shows the resulting capture and master oscillator frequency output with divider circuit originated jitter of previous systems employing divider trains; and curve B, the harmonic step type correction provided with low frequency loop overriding of direct high frequency loop correction to effectuate ultimate locking on the desired frequency, and with the direct loop correction, maintenance of the desired frequency without divider jitter content.

Referring to the drawing:

The digital stabilized master oscillator system 10 is shown to have a voltage controlled master oscillator 11 providing a frequency output to terminal 12. The output of master oscillator 11 is also applied to the switched dividers circuit 13, having associated switch circuit 14 for selective frequency control of the switched dividers circuit in effectuating frequency division by factors up to "*n*" divisions as controlled by a frequency selector 15. The frequency of the output through the dividers is, after frequency capture of the master oscillator on the selected desired output frequency, equal to the reference output frequency of reference frequency source 16.

Both the frequency output of the reference frequency source 16 and the frequency output of the switched dividers circuit 13 are applied as inputs to frequency and phase discriminator 17. This discriminator, a frequency and phase discriminator such as disclosed in my copending application Serial No. 346,614, entitled "Combined Frequency and Phase Discriminator" and filed February 24, 1964, or one of many other frequency and phase discriminators, develops an output voltage dependent on the relationship of its reference frequency input and its frequency input out of switched dividers circuit 13. This output is passed to and through a low frequency loop filter 18 having a bandpass, for example, up to approximately 10 c.p.s. to auxiliary phase discriminator 19. This has a pronounced effect upon the correction voltage output of phase discriminator 19 applied in adjusting and correcting the frequency of master oscillator 11. It should be noted that use of a low frequency loop filter 18 having a bandpass bandwidth up to approximately 10 c.p.s. permits master oscillator capture within approximately one tenth second while being of such bandpass width as to stop deleterious short term jitter.

In the auxiliary high frequency loop used for effectively achieving phase capture, the frequency output of master oscillator 11 is also directly applied as an input to phase discriminator 19 in addition to frequency output terminal 12 and switched dividers circuit 13. The auxiliary phase discriminator 19 also requires reference frequency harmonic input generated through a pulse generator 20 acting on a reference frequency input from reference frequency source 16. Pulse generator 20 develops very narrow pulses at the reference frequency having harmonic frequency content coextensive with the range of available selected master oscillator output frequencies. The pulse output train of pulse generator 20 is passed to and through harmonic bandpass filter 21. The filter 21 has a bandpass effectively passing harmonics of the reference frequency over the range of selectable master oscillator output frequencies as an input to auxiliary phase discriminator 19. Various harmonics of the reference frequency passed by filter 21 interact in phase discriminator 19 with the master oscillator output frequency in developing a corrective voltage output combined with the corrective voltage input to phase discriminator 19 from filter 18, of the low frequency loop. The resulting combined voltage from phase discriminator 19 is passed to and through high frequency loop filter 22 as a resultant frequency and corrective control voltage to master oscillator 11.

Referring also to FIGURE 2, a typical phase discriminator schematic is shown that may be one of various available phase discriminator circuits usable as auxiliary phase discriminator 19. The frequency and phase discriminator 17 output, passed through low frequency loop filter 18, and passed as an input to phase discriminator 19, is connected through resistor 23 to tap 24 of secondary coil 25 of transformer 26. This input from low frequency loop filter 18, which is also RF shunted to ground through capacitor 27, is passed through the secondary coil 25 and in phase discriminator action additional frequency input modified form through one or the other, depending upon polarity, of diodes 28 and 29, and from the common junction of the diodes through resistor 30 as a frequency controlling voltage input to master oscillator 11.

The reference frequency harmonic pulse train out of pulse generator 20, passed by harmonic bandpass filter 21, is applied to one end of primary coil 31 of transformer 26 with the other end of coil 31 connected to ground. The frequency output of master oscillator 11, as applied to phase discriminator 19, is passed through capacitor 32 to the tap 24 of secondary coil 25. The interaction of various respective harmonic frequencies, induced in secondary coil 25 from the pulse train signal input to coil 31, with the variable adjustable frequency output of master oscillator 11, applied to tap 24 in the secondary coil 25, in a discriminator rectifying action in discriminator 19 with diodes 28 and 29, develops a phase discriminator voltage output component. This voltage component combined with any low frequency loop output frequency controlling voltage is the master oscillator frequency correcting and controlling voltage passed from the junction of the diodes through resistor 30 and high frequency loop filter 22 as an input to the master oscillator 11. The auxiliary phase discriminator 19 compares respective harmonics of the reference frequency directly with the master oscillator output frequency, which, when captured and locked, is a multiple of the reference frequency. This provides a short term correction independent of the voltage dividers circuit 13 low frequency loop, and therefore, free from switched divider originated jitter. If the frequency out of the reference frequency source should be, for example, 10 kc., the bandpass of the high frequency loop filter 22 might be, for example, up to approximately 2 kc.

During operation it should be noted that the high frequency or auxiliary loop has multiple stable points as indicated in the capture and holding characteristic curve B of FIGURE 3, as opposed to the characteristic curve A of FIGURE 3, with its inherent divider train originated jitter. The multiple stable points result in a stairstep-like corrective action in adjusting to the desired frequency level whenever the switched dividers circuit 13 is frequency selector 15 control switched for a desired frequency output from master oscillator 11. This stairstep-like action in adjusting to the desired frequency is actually reference frequency harmonic steps appearing as multiple stable points in the high frequency auxiliary loop. Each of the stable points has a good short term correction ability, whereas the low frequency divider loop has only one stable point in respect to each selected desired frequency output from the master oscillator 11, but because of division through the switched dividers circuit 13, the gain, and therefore the ability to correct the master oscillator on a short term basis, is much less.

Thus, as the process of capture begins, the high frequency loop effectuates capture momentarily until the low frequency loop, in its inherently slower action, has an opportunity to override the high frequency loop capture. This results in an immediate drop down to the next multiple of the discriminator reference frequency harmonic input and hangs there momentarily until the process is again repeated with the low frequency loop again overriding that high frequency loop capture level in a repeated step doorstep-like frequency adjustment to, ultimately, the correct desired master oscillator output frequency. The doorstep capture action to the desired master oscillator output frequency is accomplished in a relatively brief period of time; for example, probably within one tenth second, subsequent to which, both the low frequency loop and the high frequency loop thereafter remain satisfied. This condition is maintained until the switched dividers circuit 13 is control switched by switches 14 and frequency selector 15 for a different desired master oscillator output frequency.

Thus, it may be seen that this invention provides an effective digital stabilized master oscillator circuit with both an auxiliary high frequency loop and a low frequency divided loop having jitter free stability at each chosen frequency. Further, it provides operation wherein the low frequency divided loop effects capture and locking of the master oscillator on the correct selected frequency with precise long term stability, while the auxiliary direct high frequency loop provides jitter free short term stability at the chosen frequency.

Whereas this invention is here illustrated and described with respect to a specific embodiment thereof, it should be realized that various changes may be made without departing from the essential contribution to the art made by the teachings hereof.

I claim:

1. A digital stabilized master oscillator system having switch frequency selector control means capable of switching the system for various desired master oscillator output frequencies, having switched divider circuit means switch controlled by said frequency selector control means, with the master oscillator system capable of capture and hold of the particular frequency selected at any time, from the available control selected master oscillator output frequencies, substantially free from jitter, wherein, said master oscillator system includes: a control voltage frequency adjustable master oscillator; frequency controlling voltage input means for said master oscillator; switched divider circuit means; switch frequency selector control means controllably selecting the division factor and thereby frequency output from the master oscillator; with the master oscillator system having a low frequency loop including said switched divider circuit means connected for receiving the output frequency of said master oscillator, a reference frequency source, and a frequency and phase discriminator connected for receiving as inputs the output of said switched divider circuit means and the reference frequency of said reference frequency source, and with said frequency and phase discriminator having a frequency corrective voltage output connected to the frequency controlling voltage input means of said control voltage frequency adjustable master oscillator; and having a high frequency loop with a phase discriminator connected for receiving the frequency output of said master oscillator, a pulse generator connected to said reference frequency source and providing a pulse train output at the reference frequency through connective means to said phase discriminator, and with the phase discriminator having a voltage output connection to the frequency controlling voltage input means of said master oscillator.

2. The digital stabilized master oscillator system of claim 1 wherein, the frequency corrective voltage output of said frequency and phase discriminator in the low frequency loop is connected through the phase discriminator of the high frequency loop to the frequency controlling voltage input means of said master oscillator.

3. The digital stabilized master oscillator system of claim 2 wherein, a filter is included in the low frequency loop between said frequency and phase discriminator and said phase discriminator of the high frequency loop; and wherein an additional filter is included in said high frequency loop between said phase discriminator and the frequency controlling voltage input means of said master oscillator.

4. The digital stabilized master oscillator system of claim 3 wherein, a harmonic bandpass filter is included in the connective means between said pulse generator and said phase discriminator.

No references cited.

NATHAN KAUFMAN, *Primary Examiner.*

JOHN KOMINSKI, *Examiner.*